United States Patent
McKinlay et al.

(10) Patent No.: US 9,401,163 B2
(45) Date of Patent: Jul. 26, 2016

(54) MULTI-STACK READER WITH SPLIT MIDDLE SHIELD

(71) Applicant: Seagate Technology LLC, Cupertino, CA (US)

(72) Inventors: Shaun Eric McKinlay, Eden Prairie, MN (US); Eric Walter Singleton, Maple Plain, MN (US); Samuel Martin Barthell, Minneapolis, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/323,027

(22) Filed: Jul. 3, 2014

(65) Prior Publication Data

US 2016/0005424 A1    Jan. 7, 2016

(51) Int. Cl.
*G11B 5/39* (2006.01)
*G11B 5/115* (2006.01)
*G11B 5/29* (2006.01)

(52) U.S. Cl.
CPC ........ *G11B 5/115* (2013.01); *G11B 5/29* (2013.01); *G11B 5/3912* (2013.01); *G11B 5/3958* (2013.01)

(58) Field of Classification Search
CPC .......... G11B 5/33; G11B 5/39; G11B 5/3903; G11B 5/3906; G11B 5/3912; G11B 5/3945; G11B 5/3948; G11B 5/3951; G11B 5/3958; G11B 5/3961; G11B 5/3964
USPC .............. 360/314, 315, 316, 319, 121, 324.1, 360/324.11, 324.12, 324.2
See application file for complete search history.

(56) References Cited

U.S. PATENT DOCUMENTS

| | | | |
|---|---|---|---|
| 6,819,530 B2 | 11/2004 | Gill | |
| 7,408,730 B2 | 8/2008 | Yamagishi | |
| 7,436,632 B2 | 10/2008 | Li et al. | |
| 8,208,228 B2* | 6/2012 | Maat et al. | 360/314 |
| 8,243,398 B2 | 8/2012 | Partee et al. | |
| 8,786,987 B2* | 7/2014 | Edelman et al. | 360/324.12 |
| 8,824,106 B1 | 9/2014 | Garfunkel et al. | |
| 8,873,204 B1 | 10/2014 | Gao et al. | |
| 8,891,207 B1* | 11/2014 | Li et al. | 360/316 |
| 8,908,333 B1 | 12/2014 | Rudy et al. | |
| 8,970,988 B1 | 3/2015 | Li et al. | |
| 9,042,058 B1* | 5/2015 | Li et al. | 360/316 |
| 9,042,059 B1* | 5/2015 | Katine | G11B 5/3909 360/316 |
| 9,087,527 B1* | 7/2015 | Li | G11B 5/02 |
| 9,099,125 B1* | 8/2015 | Hattori | G11B 5/3912 |

(Continued)

OTHER PUBLICATIONS

Van Dijken et al., "IrMn as exchange-biasing material in systems with perpendicular magnetic anisotropy", Journal of Applied Physics, vol. 97, 2005, pp. 10K114-1-10K114-3.

(Continued)

*Primary Examiner* — Jefferson Evans
(74) *Attorney, Agent, or Firm* — Hollingsworth Davis, LLC

(57) ABSTRACT

A reader includes top and bottom reader stacks disposed between a top and bottom shield. The top and bottom reader stacks are offset relative to each other in a downtrack direction. Top side shields surround the top reader stack in a crosstrack direction, and bottom side shields surround the bottom reader stack in the crosstrack direction. A split middle shield is between the top and bottom reader stacks and the top and bottom side shields. The split middle shield includes top and bottom portions separated by an isolation layer, the top and bottom portions respectively coupled to the top and bottom reader stacks.

13 Claims, 5 Drawing Sheets

(56) References Cited

U.S. PATENT DOCUMENTS

| | | |
|---|---|---|
| 9,190,082 B2 | 11/2015 | Sapozhnikov et al. |
| 2003/0151855 A1* | 8/2003 | Molstad et al. ............... 360/316 |
| 2011/0069413 A1 | 3/2011 | Maat et al. |
| 2011/0134572 A1 | 6/2011 | Qiu et al. |
| 2012/0307404 A1 | 12/2012 | Braganca et al. |
| 2013/0265039 A1 | 10/2013 | Cai et al. |
| 2013/0286502 A1 | 10/2013 | Erden et al. |
| 2013/0286511 A1 | 10/2013 | Edelman et al. |
| 2014/0119106 A1 | 5/2014 | Lee et al. |
| 2015/0062735 A1 | 3/2015 | Sapozhnikov et al. |
| 2015/0062755 A1 | 3/2015 | Sapozhnikov et al. |
| 2015/0170678 A1 | 6/2015 | Mastain |
| 2015/0255092 A1 | 9/2015 | Macken et al. |
| 2015/0269956 A1 | 9/2015 | Isowaki et al. |
| 2016/0005425 A1* | 1/2016 | McKinlay ............... G11B 5/29 360/121 |

OTHER PUBLICATIONS

Dec. 10, 2015, File History for U.S. Appl. No. 14/192,467.
Oct. 6, 2015, File History for U.S. Appl. No. 14/192,467.
Oct. 6, 2015, File History for U.S. Appl. No. 14/323,119.
Apr. 14, 2016, File History for U.S. Appl. No. 14/192,467.
Apr. 14, 2016, File History for U.S. Appl. No. 14/323,119.

* cited by examiner

MULTI-STACK READER WITH SPLIT MIDDLE SHIELD

SUMMARY

The present disclosure is related to a multi-stack reader with a split middle shield. In one embodiment, a reader includes top and bottom reader stacks disposed between a top and bottom shield. The top and bottom reader stacks are offset relative to each other in a downtrack direction. Top side shields surround the top reader stack in a crosstrack direction, and bottom side shields surround the bottom reader stack in the crosstrack direction. A split middle shield is between the top and bottom reader stacks and the top and bottom side shields. The split middle shield includes top and bottom portions separated by an isolation layer, the top and bottom portions respectively coupled to the top and bottom reader stacks.

In another embodiment, a reader includes a first reader stack surrounded by first side shields in a crosstrack direction. A first middle shield portion is electrically coupled to the first reader stack, and an isolation layer is on the first middle shield portion. A second middle shield portion is on the isolation layer, and a second reader stack is electrically coupled to the second middle shield portion and surrounded by second side shields in the crosstrack direction. The first and second middle shield portions encompass the first and second side shields.

In another embodiment, a method involves positioning top and bottom reader stacks of a reader between a top and bottom shield. The top and bottom reader stacks are offset relative to each other in a downtrack direction. At least one of top and bottom reader stacks are magnetically biased via top and bottom side shields that surround the respective top and bottom reader stacks in a crosstrack direction. At least one of the top and bottom reader stacks are magnetically stabilized via a split middle shield located between the top and bottom reader stacks and the top and bottom side shields. The split middle shield includes top and bottom portions separated by an isolation layer.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same/analogous components in multiple figures. The figures are not necessarily to scale.

DETAILED DESCRIPTION

Magnetic recording devices such as hard disk drives utilize magnetic read/write heads that are held close to the surface of a spinning magnetic disk. The read/write head includes a write transducer that causes a change in magnetic orientation of bits within tracks on the disk. The read/write head also includes a read transducer that follows the tracks and generates a signal based on variations in magnetic field. These signals are used to read the bits.

Most hard disk drives utilize a single read and write transducer per read/write head. There may be multiple read/write heads in a hard disk drive, e.g., one for each surface of each disk in the drive. In order to increase data density, it is envisioned that two or more read transducers and/or write transducers may be included within a single read/write head. While there are challenges in increasing the number of transducers in the read/write head, this strategy may help sustain the current rate of areal density increase using existing recording media.

The present disclosure is related to systems, methods, and apparatuses utilizing magnetic readers with multiple read sensors for reading magnetic recording media, e.g., hard disks. Generally, current hard disk devices utilize a read/write head (also referred to as a slider) with a single read transducer for reading data. Multiple read/write heads may be used, e.g., separate read/write heads positioned at top and bottom surfaces of one or more magnetic disks. New architectures are being proposed that use more than one read transducer per read/write head. These new architectures use multiple read transducers to read data that are recorded on a magnetic media at an increased areal density and/or increased data rate compared to current recording architectures using a single read transducer. These architectures may also employ multiple writers.

Generally, a reader with two or more read transducers (or stacks) may be used in a multi-dimensional recorder, such as a two-dimensional magnetic recording (TDMR) system. A TDMR device as described herein reads from two or more reader stacks on the same read/write head. The reader stacks may be aligned over a single track, or may be spread apart so that data from more than one track is read at one time. The signals from the different stacks may be decoded at the same time, and used for purposes such as reading tracks simultaneously, cancellation of crosstrack interference, single track error correction, etc.

Figure 1:
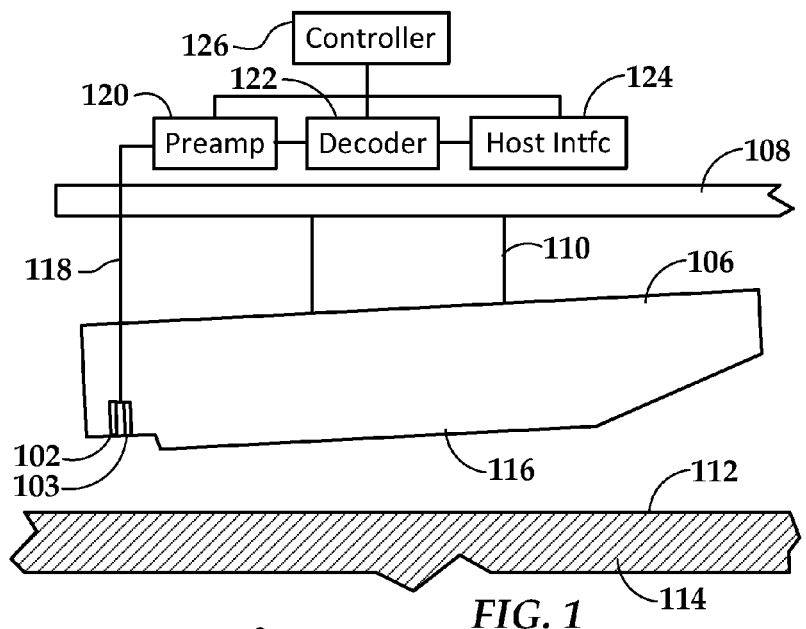
FIG. 1 is a block diagram of an apparatus according to an example embodiment.

Details of a multi-reader device according to an example embodiment are shown in FIG. 1. The components shown in FIG. 1 may be used in a magnetic data storage device such as a hard disk drive. Generally, first and second read transducers 102, 103 are housed at a trailing edge of a slider 106, also sometimes referred to as a reader, read/write head, etc. More than two read transducers may be used. The first and second read transducers 102, 103 include magnetoresistive stacks, such as giant magnetoresistive (GMR) stacks, tunneling magnetoresistive (TMR) stacks, etc. The slider 106 is coupled to arm 108 by way of a suspension 110 that allows some relative motion between the slider 106 and arm 108. In addition to the read transducers 102, 103, the slider 106 may include one or more write transducers (not shown), such as a write pole and coil. When the slider 106 is located over surface 112 of a magnetic disk 114, a flying height is maintained between the slider 106 and surface 112 by a downward force of arm 108. This downward force is counterbalanced by an air cushion that exists between the surface 112 and a media-facing surface 116 of the slider 106 when the disk 114 is rotating.

Changes in local magnetic field caused by the moving disk 114 induce a change in resistance of the read transducers 102, 103. The read transducers are coupled to a preamplifier 120 by way of signal lines 118. Generally, the preamplifier 120 amplifies and conditions the analog signals (which may include multiple signals) received via signal lines 118. The preamplifier 120 may also provide bias voltages to the read transducers to achieve a desired electrical operating point. The amplified signals received via the preamplifier 120 are used for other processing modules such as decoder 122. The decoder 122 determines a digital output from the analog signals, the digital output being used by a host via host interface 124, as well as other system components (not shown). The decoder 122 may be utilize a multi-dimensional decoding algorithm to simultaneously process signals from the two or more proximately located read transducers 102, 103. The processing of the signals and data is generally managed by a controller 126, which may include a microprocessor and/or other logic circuits.

As shown in FIG. 1, the first and second read transducers 102, 103 are offset from one another in a down-track direction, and may also be offset in a cross-track direction. This corresponds to stacked configuration of the read transducer 102, 103, wherein the one of the read transducers is layered upon the other during manufacture. An example of a reader 200 with stacked read transducers according to an example embodiment is shown in the perspective view of FIG. 2.

The reader 200 is shown as cut away near a media-facing surface 202 of the reader 200, with layers above reader stack 204 being further cut away. The reader 200 is formed by depositing layers on a substrate. In this example, reader stack 206 is formed before the read stack 204, and so the reader stacks 204, 206 are referred to as top and bottom reader stacks. The top and bottom reader stacks 204, 206 are offset relative to each other in a downtrack direction 210, and may be aligned with each in a crosstrack direction 208. For example, the stacks 204, 206 may share a common centerline 209 that runs in the downtrack direction 210.

The top and bottom reader stacks 204, 206 include magnetoresistive sensors having a stack of material layers, such as free layer, pinning layer, fixed layer, etc. The type and arrangement of layers may vary depending on the type of sensor, e.g., GMR, TMR, etc. The top and bottom reader stack 204, 206 are disposed between a top shield 212 and bottom shield 214, the former being shown cut away. In some embodiments, the top and bottom shields 212, 214 include respective synthetic antiferromagnetic (SAF) layers. For example, the top and bottom shields 212, 214 may include a single SAF layer, or multiple layers of SAF and antiferromagnetic (AFM) materials.

A split middle shield 216 is located between the top and bottom reader stacks 204, 206. The split middle 216 shield includes top and bottom portions 216a-b separated by an isolation layer 216c. The isolation layer 216c may provide at least electrical isolation between the top and bottom portions 216a-b. The top and bottom portions 216a-b of the middle shield 216 are respectively coupled to the top and bottom reader stacks 204, 206. Electrical contacts/leads (not shown) are coupled to the top and bottom portions 216a-b of the middle shield 216, as well as to the top and bottom shields 212, 214. These leads electrically connect the top and bottom reader stacks 204, 206 to sensing circuitry, e.g., via independent signal line pairs or via two independent signal lines and a shared common signal line.

Figure 2:
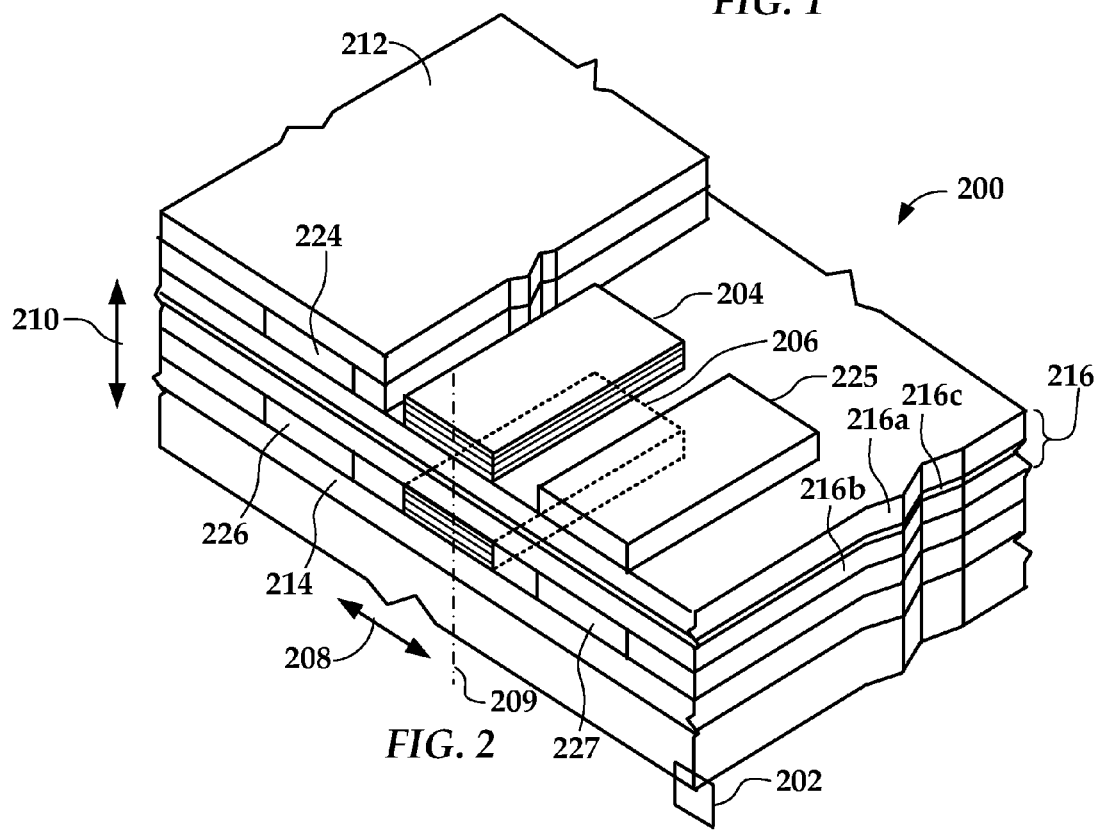
FIG. 2 is a perspective view of a reader according to an example embodiment.

The top and bottom reader stacks 204, 206 are each surrounded in a cross-track direction by left side shields 224, 226, and right side shields 225, 227, respectively. The bottom shield 214, the middle shield 216, and the top shield 212 extend to cover the bottom and top reader stacks 206, 204 and the respective side shields 224-227 in the cross track direction 208. It will be understood that the diagram of FIG. 2 is presented for purposes of illustration and not limitation, and the shapes and sizes of the various components of the reader 200 may vary from what is shown here.

In some systems, it may be desirable to minimize downtrack spacing between the reader stacks 204, 206. This can, for example, minimize the effects of skew in misaligning the reader stacks 204, 206 over tracks on a recording medium. At the same time, this minimization of spacing will be balanced between the need to ensure adequate magnetic and electrical separation/shielding between the readers, as well as ensuring magnetic stability of the readers. For example, the side shields 224-227 generally apply a magnetic field across the reader stacks 204, 206, and so adjacent materials should not cause instability in these magnetic fields.

Generally, embodiments described below include middle shield 216 and side shields 224-227 that are configured to provide isolation and magnetic stability for the reader stacks 204, 206, while allowing downtrack distance between the reader stacks 204, 206 to be minimized. One thing that these embodiments have in common, as seen in FIG. 2, is that the middle shield 216 extends to cover the top and bottom reader stacks 204, 206 and the respective side shields 224-227 in the cross-track direction. As such, the formation of the reader involves defining the outer dimensions of the bottom reader stack 206 (e.g., mask, mill/etch), forming the middle shield 216, then forming and defining outer dimension of the top reader stack 204.

Due to the outer dimensions/shapes of the top and bottom reader stacks 204, 206 being defined in separate operations, the precision of downtrack alignment between the reader stacks 204, 206 is dependent on the ability to align photoresist masks in different processing steps. This is in contrast to a self-aligned process where the stacks are deposited on one another with a middle shield in-between, then a single process (e.g., mask, mill/etch) is used to define the outer dimensions of both stacks and the middle shield in one operation. While this can ensure precise alignment between reader stacks, the present embodiments may have advantages in some configurations, e.g., where a specified cross-track offset between reader stacks is desired.

Figure 3:
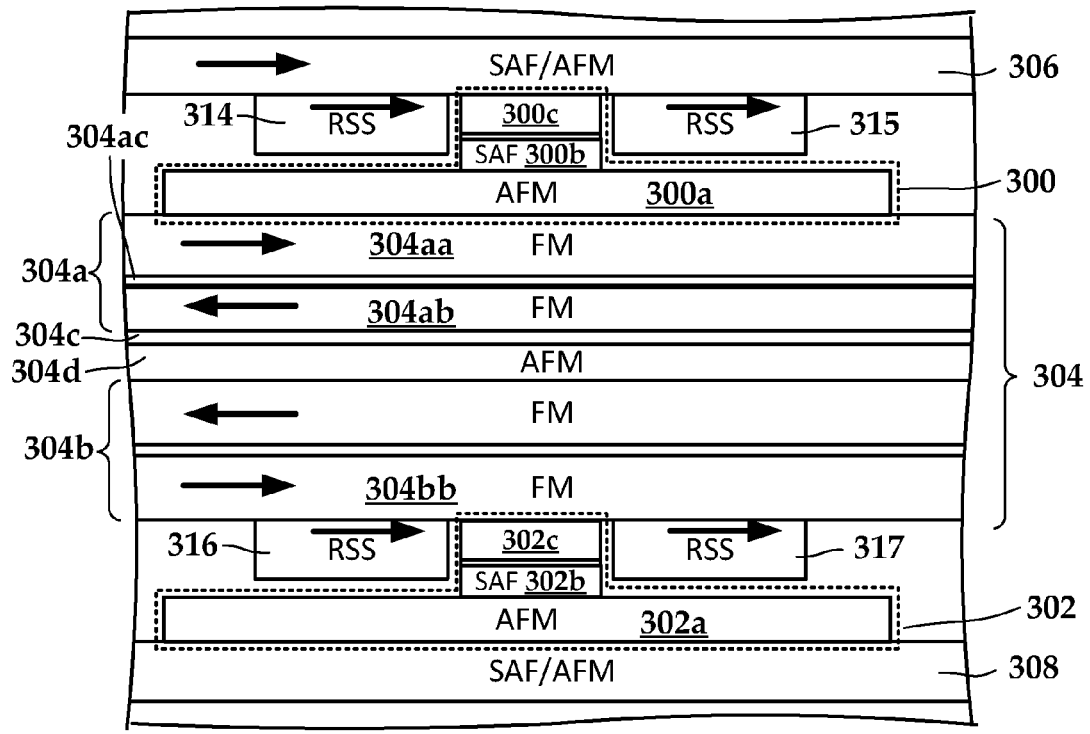
FIGS. 3-6 are media-facing-surface views of the readers according to example embodiments.

In FIG. 3, a block diagram shows a view at the media-facing surface of a reader according to an example embodiment. Dashed outlines surround first and second reader stacks 300, 302. The reader stacks 300, 302 are arranged from top to bottom in the downtrack direction, and so may be referred to as top and bottom reader stacks, respectively. The reader stacks 300, 302 include respective AFM and SAF layers 300a-b, 302a-b as well as other layers (e.g., free layer) in stack portions 300c, 302c. In this example, the stacks' AFM layers 300a, 302a are wider in a crosstrack direction than other layers 300b-c, 302b-c of the stacks 300, 302. In other arrangements, the AFM layers 300a, 302a may have the same crosstrack width as the other layers 300b-c, 302b-c of the stacks 300, 302.

A middle shield 304 is located between the top and bottom reader stacks 300, 302. The middle shield 304 includes a top portion 304a and a bottom portion 304b. Each of the top and bottom portions 304a-b are SAF multilayer structures that include magnetic layers (e.g., layers 304aa-ab) separated by a magnetic coupling layer (e.g., layer 304ac) that may include a material such as Ru. The pairs of ferromagnetic layers have opposite magnetic orientation, e.g., ferromagnetic layer 304aa has a separate orientation from layer 304ab, as indicated by the arrows. Flux closures at the crosstrack ends of the top and bottom portions 304a-b results in magnetic stability of the structures. The top and bottom portions 304a-b of the middle shield 304 are separated by an isolation layer 304c. The isolation layer 304c provides electrical isolation between the reader stacks 300, 302, and thickness of the layer 304c can be set to provide a desired amount of magnetic shielding between the reader stacks 300, 302. An AFM layer 304d, e.g., formed of IrMn, is layered between the bottom portion 304b and the isolation layer 304c.

Top and bottom shields 306, 308 are located respectively above the top reader stack 300 and below the bottom reader stack 302. Both top and bottom shields 306, 308 include SAF/AFM multi-layers. The top shield 306 is a cap layer for the top stack 300, and the bottom shield 308 is a seed layer for the bottom reader stack 302. Side shields 314-317 surround at least part of the reader stacks 300, 302. As indicated by the arrows, the side shields 314-317 provide a magnetic bias to the reader stacks 300, 302. As such, the adjacent layers are configured with the same magnetic orientation. For example, bottom layer 304bb of middle shield 304 is magnetically aligned with side shields 316, 317. A similar magnetic alignment exists between at least a bottom part of the top shield 306 and side shields 314, 315. The magnetic alignments ensure stability of the bias fields applied to the reader stacks 300, 302 by the side shields 314-317.

As previously noted, the middle shield 304 (as well as top and bottom shields 306, 308) extends to cover the stacks 300, 302 and associated side shields 314-317. In this context, "covering" refers to a projection of the middle shield 304 on a substrate-parallel plane that covers a projection of both the stacks 300, 302 and side shields 314-317 onto the same substrate-parallel plate. Thus, the middle shield 304 can be considered to cover the top stack 300 and top side shields 314, 315, even though the stack and shields are formed on top of the middle shield.

Figure 4:
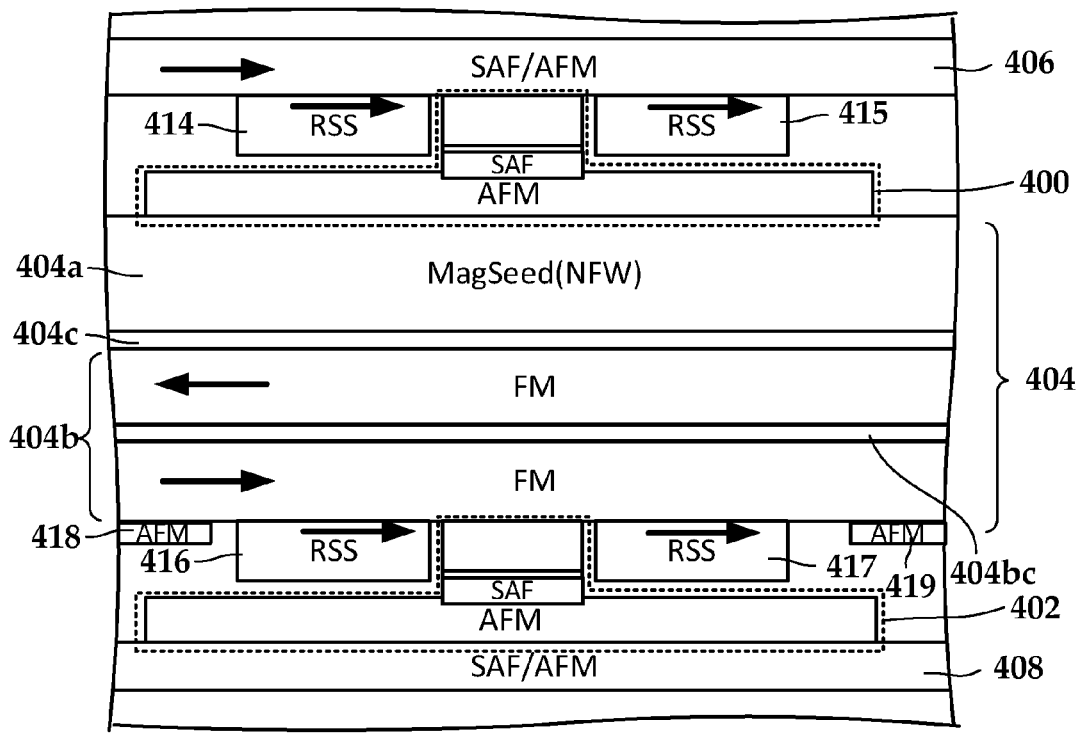

In FIG. 4, a block diagram shows a view at the media-facing surface of a reader according to another example embodiment. First and second reader stacks 400, 402 are arranged from top to bottom in the downtrack direction, and so may be referred to as top and bottom reader stacks, respectively. The reader stacks 400, 402 may include layers and dimensions and described for reader stacks 300, 302 in FIG. 3.

A middle shield 404 is located between the top and bottom reader stacks 400, 402. The middle shield 304 includes a top portion 404a and a bottom portion 404b. The top portion 404a is configured as solid magnetic seed, e.g., a soft ferromagnetic material such as Co, Ni, Fe alloys. The bottom portion 404b includes an SAF multilayer similar to bottom portion 304b in FIG. 3. The top and bottom portions 404a-b of the middle shield 404 are separated by an isolation layer 404c. The isolation layer 404c provides electrical isolation between the reader stacks 400, 402, and thickness of the layer 404c can be set to provide a desired amount of magnetic separation between the reader stacks 400, 402.

Side shields 414-417 surround the left and right sides of the reader stacks 400, 402. Due to the use of the soft magnetic top portion 404a, AFM "tabs" 418, 419 are disposed outside of the bottom side shields 416, 417, respectively, and may be recessed from the media-facing surface. The AFM tabs 418, 419 pin the ends of the SAF multilayer of the lower portion 404b of the middle shield 404. This can prevent instability affecting the side shields 416, 417 due to the soft magnetic top portion 404a. Similar tabs (not shown) can be provided outside the upper side shields 415, 415.

Top and bottom shields 406, 408 are located respectively above the top reader stack 400 and below the bottom reader stack 402. These shields can be made of an SAF/AFM multilayer structure, similar to top and bottom shields 306, 308 shown in FIG. 3. For example, a portion of the top shield 406 near the side shields 414, 415 can be magnetically aligned with the side shields 414, 415. This may preclude the need for AFM tabs as used for the bottom reader stack 402.

Figure 5:
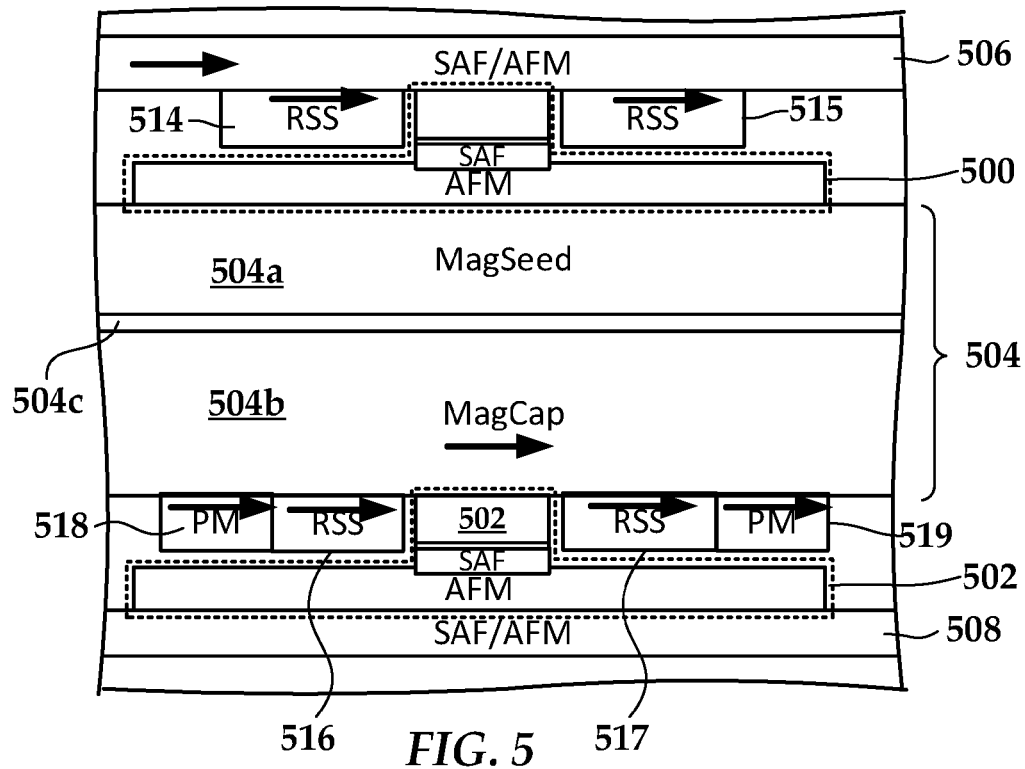

In FIG. 5, a block diagram shows a view at the media-facing surface of a reader according to another example embodiment. First and second reader stacks 500, 502 are arranged from top to bottom in the downtrack direction, and so may be referred to as top and bottom reader stacks, respectively. The reader stacks 500, 502 may include layers and dimensions and described for reader stacks 300, 302 in FIG. 3.

A middle shield 504 is located between the top and bottom reader stacks 500, 502. The middle shield 304 includes a top portion 504a and a bottom portion 504b. The top and bottom portions 504a-b are both configured as solid magnetic layers (seed and cap, respectively), e.g., made of a soft magnetic material. The top and bottom portions 504a-b of the middle shield 504 are separated by an isolation layer 504c. The isolation layer 504c provides electrical isolation between the reader stacks 500, 502, and thickness of the layer 504c can be set to provide a desired amount of magnetic separation between the reader stacks 500, 502.

Side shields 514-517 surround the left and right sides of the reader stacks 500, 502. Due to the use of the soft magnetic top and bottom portions 404a-b of the middle shield, permanent magnets (PM) 518, 519 are disposed outside of the bottom side shields 516, 517, respectively. The permanent magnets 518, 519 pin the side shields 516, 517 as well as the lower portion 504b of the middle shield 504. Similar permanent magnets or AFM tabs (not shown) can be provided outside the upper side shields 514, 515.

Top and bottom shields 506, 508 are located respectively above the top reader stack 500 and below the bottom reader stack 502. These shields can be made of an SAF structure, similar to top and bottom shields 306, 308 shown in FIG. 3. For example, a portion of the top shield 506 near the side shields 514, 515 can be magnetically aligned with the side shields 514, 515. This may preclude the need for permanent magnets or AFM tabs as used for the bottom reader stack 502.

Figure 6:
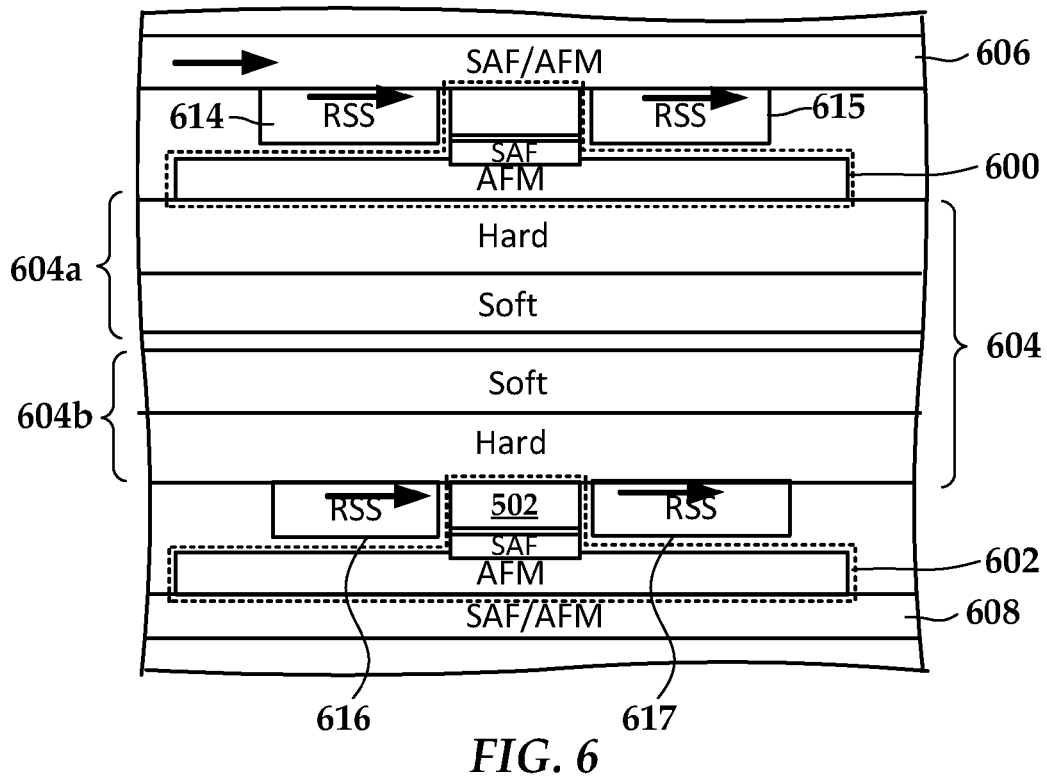

In FIG. 6, a block diagram shows a view at the media-facing surface of a reader according to another example embodiment. First and second reader stacks 600, 602 are arranged from top to bottom in the downtrack direction, and so may be referred to as top and bottom reader stacks, respectively. The reader stacks 600, 602 may include layers and dimensions and described for reader stacks 300, 302 in FIG. 3.

A middle shield 604 is located between the top and bottom reader stacks 600, 602. The middle shield 604 includes a top portion 604a and a bottom portion 604b. The top and bottom portions 604a-b are both configured as magnetic bi-layers, e.g., made of exchange-coupled layers of soft and hard magnetic material. The top and bottom portions 604a-b of the middle shield 604 are separated by an isolation layer 604c. The isolation layer 604c provides electrical isolation between the reader stacks 600, 602, and thickness of the layer 604c can be set to provide a desired amount of magnetic separation between the reader stacks 600, 602.

Side shields 614-617 surround the left and right sides of the reader stacks 600, 602. The hard magnetic layer of middle shield bottom portion 604a is adjacent the bottom side shields 616, 617, making the side shields 616, 617 more stable at the expense of shielding. Inverting the lower portion 604b so that the hard layer is separated from the side shields 616, 617 improves the reader shielding, but at the expense of side shield stability.

Top and bottom shields 606, 608 are located respectively above the top reader stack 600 and below the bottom reader stack 602. These shields can be made of an SAF/AFM structure, similar to top and bottom shields 306, 308 shown in FIG. 3. For example, a portion of the top shield 606 near the side shields 614, 615 can be magnetically aligned with the side shields 614, 615.

Table 1 below shows different arrangements of a reader according to example embodiments. The bi-layer embodiments refer to an exchange coupled soft/hard magnetic bi-layer. The embodiments that are illustrated in FIGS. 3-6 are indicated in Table 1. Other possible combinations that are not shown in the figures are also listed.

TABLE 1

| Bottom Reader | | Top Reader | | |
|---|---|---|---|---|
| Tab | Bot. Mid. Shield | Tab | Top Mid. Shield | Shown |
| None | SAF/AFM | None | SAF/AFM | FIG. 3 |
| AFM | SAF | None | Solid | FIG. 4 |
| PM | Solid | None | Solid | FIG. 5 |
| None | Bi-layer | None | Bi-layer | FIG. 6 |
| AFM | SAF/AFM | AFM | SAF/AFM | Not shown |
| PM | Solid | AFM | SAF | Not shown |
| PM | Solid | PM | Solid | Not shown |

Figure 7:
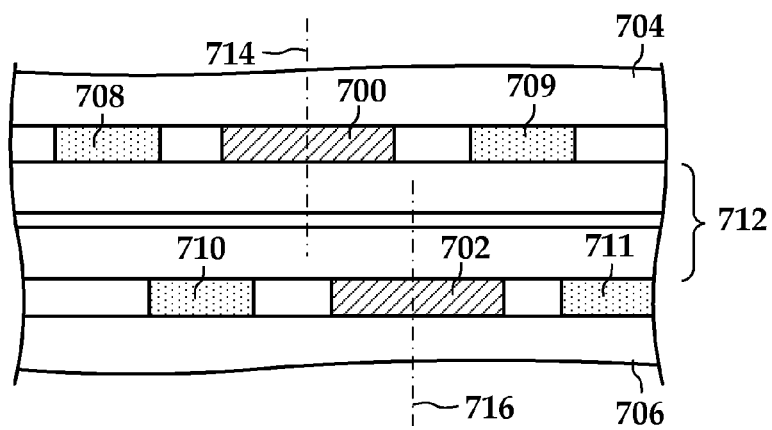
FIG. 7 is a block diagram of a reader according to another example embodiment.

As noted above, the multiple readers may be aligned with each other, e.g., both centered over a common crosstrack reference line. In other embodiments, the readers may be offset from each other in both downtrack and crosstrack directions. An example is shown in the block diagram of FIG. 7. First and second reader stacks 700, 702 are disposed between first and second downtrack shields 704, 706. First side shields 708, 709 surround the first reader stack 700 in a crosstrack direction. Second side shields 710, 711 surround the second reader stack 702 in the crosstrack direction. A split middle shield 712 is located between the first and second reader stacks 700, 702 and the first and second side shields 708-711. The split middle shield 712 includes top and bottom portions separated by an isolation layer.

As indicated by centerlines 714, 716, the first and second reader stacks 700, 702 are offset from each other in a crosstrack direction (left to right in the figure). The offset distance between centerlines 714, 716 may be less than or greater than a separation between tracks (pitch) of the recording media. A similar offset is applied to other components surrounding the reader stacks 700, 702, such as side shields 708-711 and tabs (not shown). The offset shown in FIG. 7 may be applied to any of the embodiments shown in FIGS. 3-6. The first and second reader stacks 700, 702 may be configured as top and bottom stacks, or vice versa.

Figure 8:
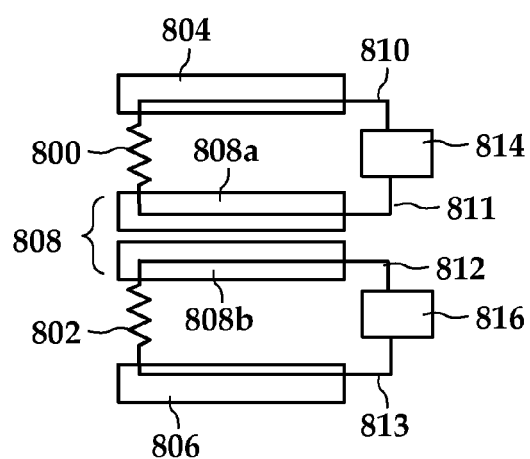
FIGS. 8 and 9 are schematic diagrams of reader connection arrangements according to example embodiments.

The embodiments described above may be used with three-terminal or four-terminal electrical connections. In reference now to FIGS. 8 and 9, schematic diagrams illustrate examples of these connection arrangements. In FIG. 8, first and second reader stacks 800, 802 have one end electrically coupled to respective first and second outer shields 804, 806 (e.g., top and bottom shields or vice versa). The other end of the first reader stack 800 is coupled to a first portion 808a of a middle shield 808. The other end of the second reader stack 802 is coupled to a second portion 808b of the middle shield 808. The first and second portions 808a-b are electrically isolated from one another. Leads 810-813 couple the reader stacks 800, 802 to respective preamplifier sections 814, 816.

Figure 9:
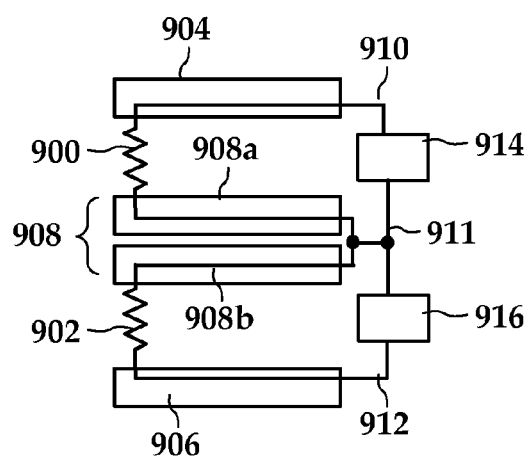

In FIG. 9, first and second reader stacks 900, 902 have one end electrically coupled to respective first and second outer shields 904, 906 (e.g., top and bottom shields or vice versa). The other end of the first reader stack 900 is coupled to a first portion 908a of a middle shield 908. The other end of the second reader stack 902 is coupled to a second portion 908b of the middle shield 908. Leads 910-912 couple the reader stacks 900, 902 to respective preamplifier sections 914, 916.

Lead 911 is a common lead that electrically couples both middle shield portions 908a-b, which would otherwise be electrically isolated from each other due to the use of isolation layer. The isolation layer may be used even where a middle lead is used, as the isolation layer may provide other functions, such as increasing magnetic isolation between the reader stacks 900, 902. In this example, the lead 911 is coupled to both portions 908a-b, e.g., by being formed to contact an edge of both portions 908a-b. In other embodiments, the middle shield portions 908a-b may be electrically coupled internally (e.g., by gaps, voids, etc., in the isolation layer) in which case the common lead 911 may be formed to contact only one of the portions 908a-b. In other embodiments, the isolation layer may be replaced with a non-magnetic conductive layer.

Figure 10:
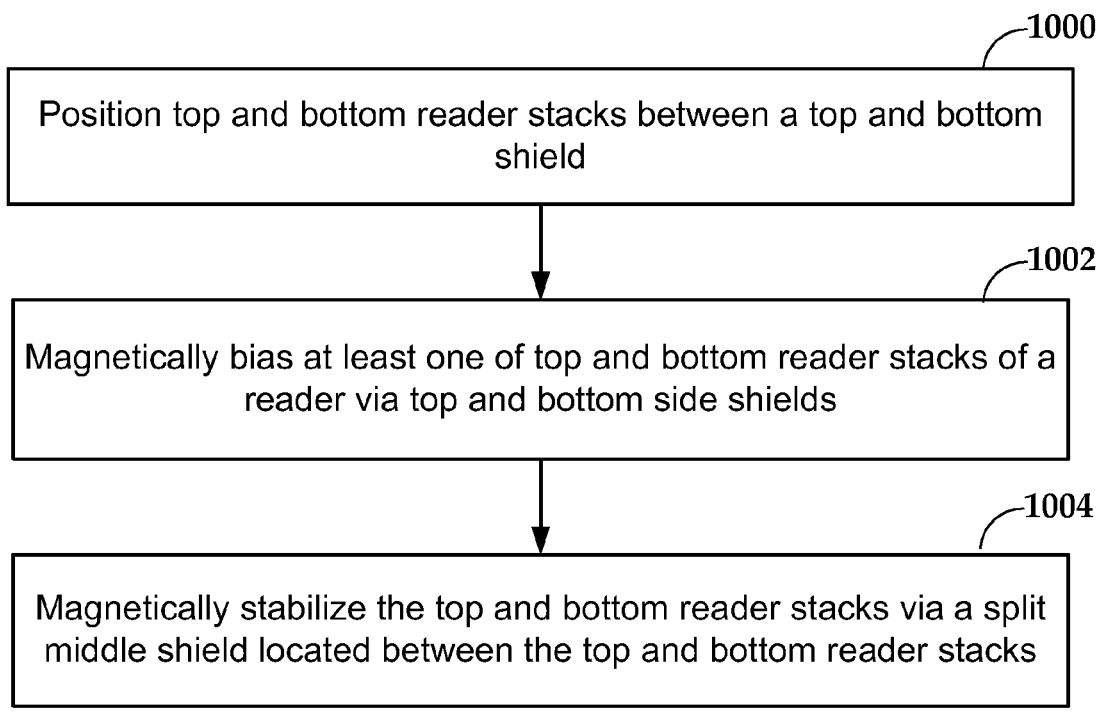
FIG. 10 is a flowchart of a method according to an example embodiment.

In reference now to FIG. 10, a flowchart illustrates a method according to an example embodiment. The method involves positioning 1000 top and bottom reader stacks of a reader between a top and bottom shield, the top and bottom reader stacks offset relative to each other in a downtrack direction. At least one of top and bottom reader stacks are magnetically biased 1002 via top and bottom side shields that surround the top and bottom reader stacks by respective a crosstrack direction. At least the bottom reader stack is magnetically stabilized 1004 via a split middle shield located between the top and bottom reader stacks and the top and bottom side shields. Magnetic stabilization of the top reader stack comes from the top shield (e.g., SAF/AFM) structure on top of the top reader stack. The split middle shield serves as magnetic shielding and stack seed layer for the top reader. The split middle shield includes top and bottom portions separated by an isolation layer. The first and second reader stacks may be used to read a two-dimensional magnetic recording signal from a recording media.

It will be understood that the concepts described hereinabove may be applied to any number of read transducers, e.g., more than two. The concepts may be similarly applicable to recording systems using multiple writers. For example a slider may include two or more write poles separated from one another in a cross-track and/or down-track direction, and multiple writer heaters may be used to independently adjust clearances of the multiple writer poles.

The use of the terms "first" and "second" describing features above or in the claims below is not intended to be limiting. For example, while examples may be provided where first and second components correspond to top and bottom components, this is not intended to imply all such first and second components described and claimed herein have the same positional relationship. Further, unless otherwise stated, the terms "first" and "second" are not intended to describe, suggest, or imply any relative priority, importance, order of manufacture, order of use, etc.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A reader comprising:
   top and bottom reader stacks disposed between a top and bottom shield, the top and bottom reader stacks offset relative to each other in a downtrack direction;
   top side shields surrounding the top reader stack in a crosstrack direction;
   bottom side shields surrounding the bottom reader stack in the crosstrack direction;
   a split middle shield between the top and bottom reader stacks and the top and bottom side shields, the split middle shield comprising top and bottom portions separated by an isolation layer, the top and bottom portions respectively coupled to the top and bottom reader stacks, the bottom portion of the split middle shield comprising a synthetic antiferromagnetic multi-layer structure, and the top portion of the split middle shield comprising a soft magnetic layer; and
   antiferromagnetic tabs surrounding the bottom side shields in the crosstrack direction.

2. The reader of claim 1, wherein the top and bottom portions of the split middle shield are electrically coupled to a common electrical lead.

3. The reader of claim 1, wherein the top and bottom portions of the split middle shield are electrically isolated and coupled to first and second electrical leads.

4. The reader of claim 1, wherein the top and bottom reader stacks are offset from one another in the crosstrack direction.

5. A reader comprising:
   top and bottom reader stacks disposed between a top and bottom shield, the top and bottom reader stacks offset relative to each other in a downtrack direction;
   top side shields surrounding the top reader stack in a crosstrack direction;
   bottom side shields surrounding the bottom reader stack in the crosstrack direction;
   a split middle shield between the top and bottom reader stacks and the top and bottom side shields, the split middle shield comprising top and bottom portions separated by an isolation layer, the top and bottom portions respectively coupled to the top and bottom reader stacks, the top and bottom portions of the split middle shield comprising respective soft magnetic layers; and
   permanent magnet tabs surrounding the bottom side shields in the crosstrack direction.

6. The reader of claim 5, wherein the top and bottom portions of the split middle shield are electrically coupled via a common electrical lead.

7. The reader of claim 5, wherein the top and bottom portions of the split middle shield are electrically isolated and coupled via first and second electrical leads.

8. The reader of claim 5, wherein the top and bottom reader stacks are offset from one another in the crosstrack direction.

9. A method comprising:
   positioning top and bottom reader stacks of a reader between a top and bottom shield, the top and bottom reader stacks offset relative to each other in a downtrack direction;
   magnetically biasing at least one of top and bottom reader stacks via top and bottom side shields that surround the respective top and bottom reader stacks in a crosstrack direction; and
   magnetically stabilizing at least one of the top and bottom reader stacks via a split middle shield located between the top and bottom reader stacks and the top and bottom side shields, the split middle shield comprising top and bottom portions separated by an isolation layer, the bottom portion of the split middle shield comprising a synthetic antiferromagnetic multi-layer structure, the top portion of the split middle shield comprising a soft magnetic layer, the reader further comprising antiferromagnetic tabs surrounding the bottom side shields in the crosstrack direction.

10. The method of claim 9, further comprising reading a two-dimensional magnetic recording signal from a recording medium via the top and bottom reader stacks.

11. The method of claim 9, wherein the top and bottom portions of the split middle shield are electrically coupled to a common electrical lead.

12. The method of claim 9, wherein the top and bottom portions of the split middle shield are electrically isolated and coupled to first and second electrical leads.

13. The method of claim 9, wherein the top and bottom reader stacks are offset from one another in the crosstrack direction.

* * * * *